(12) United States Patent
Kang et al.

(10) Patent No.: US 6,337,522 B1
(45) Date of Patent: Jan. 8, 2002

(54) STRUCTURE EMPLOYING ELECTRICALLY CONDUCTIVE ADHESIVES

(75) Inventors: Sung Kwon Kang, Chappaqua; Sampath Purushothaman, Yorktown Heights, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/106,780

(22) Filed: Jun. 30, 1998

Related U.S. Application Data

(60) Provisional application No. 60/052,173, filed on Jul. 10, 1997.

(51) Int. Cl.⁷ .......................... H01L 23/532; B23K 1/00; B23K 35/34; B32B 5/16
(52) U.S. Cl. ........................ 257/784; 257/777; 257/778; 257/764; 257/762; 257/772; 257/737; 257/738; 257/789; 257/788; 257/795; 257/673
(58) Field of Search .................................. 257/690, 737, 257/738, 777, 778, 779, 734, 766, 742, 772, 780, 783, 789, 788, 795, 784, 786, 673

(56) References Cited

U.S. PATENT DOCUMENTS

| | | | |
|---|---|---|---|
| 3,839,727 A | 10/1974 | Herdzik et al. ............... 357/71 |
| 4,701,482 A | 10/1987 | Itoh et al. .................... 523/435 |
| 5,060,844 A | 10/1991 | Behun ...................... 228/180.2 |
| 5,062,896 A | 11/1991 | Huang et al. .......... 106/287.19 |
| 5,134,460 A | 7/1992 | Brady et al. .................... 357/71 |
| 5,137,845 A | * 8/1992 | Lochon et al. ............... 438/614 |
| 5,147,084 A | 9/1992 | Behun et al. ................ 228/56.3 |
| 5,237,130 A | * 8/1993 | Kulesza et al. .............. 174/260 |
| 5,241,133 A | 8/1993 | Mullen, III et al. ....... 174/52.4 |
| 5,258,577 A | 11/1993 | Clements .................. 174/88 R |
| 5,328,087 A | * 7/1994 | Nelson et al. ............... 228/175 |
| 5,355,283 A | 10/1994 | Marrs et al. ................. 361/760 |
| 5,367,765 A | * 11/1994 | Kusaka ........................ 29/840 |
| 5,420,460 A | 5/1995 | Massingill ................... 257/693 |
| 5,445,308 A | 8/1995 | Nelson et al. ............... 228/121 |
| 5,459,287 A | 10/1995 | Swamy ........................ 174/266 |
| 5,591,941 A | * 1/1997 | Acocella et al. ............. 257/737 |
| 5,604,379 A | 2/1997 | Mori ........................... 257/738 |
| 5,611,140 A | * 3/1997 | Kulesza et al. ................ 29/832 |
| 5,672,400 A | * 9/1997 | Hansen et al. .............. 428/40.1 |
| 5,672,913 A | 9/1997 | Baldwin et al. ............. 257/737 |
| 5,681,647 A | * 10/1997 | Caillat ......................... 428/209 |
| 5,714,252 A | * 2/1998 | Hogerton et al. ............ 428/344 |
| 5,729,892 A | * 3/1998 | Dalal et al. .................. 257/737 |
| 5,761,048 A | 6/1998 | Trabucco ..................... 361/760 |
| 5,762,259 A | * 6/1998 | Hubacher et al. ....... 228/180.22 |
| 5,783,461 A | 7/1998 | Hembree ..................... 438/17 |
| 5,796,591 A | * 8/1998 | Dalal et al. .................. 366/779 |
| 5,813,870 A | * 9/1998 | Gaynes et al. ................. 439/91 |
| 5,844,168 A | 12/1998 | Schueller et al. .......... 174/52.4 |
| 5,861,322 A | * 1/1999 | Caillat et al. ................ 438/107 |

(List continued on next page.)

Primary Examiner—Alexander O. Williams
(74) Attorney, Agent, or Firm—Connolly Bove Lodge & Hutz; Daniel P. Morris

(57) ABSTRACT

A new interconnection scheme is disclosed for a tape automated bonding (TAB) package, a flip chip package and an active matrix liquid crystal display (AMLCD) panel, where an electrically conducting adhesive is used to form an electrical interconnection between an active electronic device and its components. The electrically conducting adhesive can be a mixture comprising a polymer resin, a no-clean solder flux, a plurality of electrically conducting particles with an electrically conducting fusible coating which provides a metallurgical bond between the conducting particles as well as to the substrates. The advantages of using the electrically conducting adhesives include reduction in bonding pressure and/or bonding temperature, control of interfacial reactions, promotion of stable metallurgical bonds, enhanced reliability of the joints, and others.

15 Claims, 4 Drawing Sheets

U.S. PATENT DOCUMENTS

| | | | |
|---|---|---|---|
| 5,864,470 A | | 1/1999 | Shim et al. ................. 361/777 |
| 5,868,304 A | | 2/1999 | Brofman et al. ............ 228/254 |
| 5,872,051 A | * | 2/1999 | Fallon et al. ............... 438/616 |
| 5,879,530 A | * | 3/1999 | Caillat |
| 5,918,113 A | * | 6/1999 | Higashi et al. ............. 438/119 |
| 5,943,212 A | | 8/1999 | Horiuchi et al. ............ 361/704 |
| 5,953,589 A | | 9/1999 | Shim et al. ................. 438/106 |
| 5,958,590 A | * | 9/1999 | Kang et al. ................. 428/403 |
| 5,985,043 A | * | 11/1999 | Zhou et al. |
| 5,985,456 A | * | 11/1999 | Zhou et al. ................. 428/414 |
| 6,017,634 A | * | 1/2000 | Capote et al. ............. 428/414 |
| 6,059,952 A | * | 5/2000 | Kang et al. ................. 205/143 |
| 6,114,413 A | * | 9/2000 | Kang et al. ................. 523/210 |

* cited by examiner

STRUCTURE EMPLOYING ELECTRICALLY CONDUCTIVE ADHESIVES

CROSS-REFERENCE TO RELATED APPLICATIONS

This application claims benefits of Prov. No. 60/052,173 filed Jul. 10, 1997.

This application contains subject matter that is also contained in U.S. Ser. No. 09/106,779 (YO997-212) entitled "Structure Materials and Methods for Socketable Ball Grid Array Interconnection", filed on even date; and U.S. Ser. No. 09/107,993, (YO997-213) entitled "Structure, Materials, and Applications of Ball Grid Array Interconnections", filed on even date; disclosures of which are incorporated herein by reference.

TECHNICAL FIELD

The present invention relates generally to techniques for connecting an integrated circuit device to an external circuitry, and more particularly to a tape automated bonding (TAB) interconnections by use of electrically conducting adhesive materials, and more particularly to controlled collapse chip connection (C4) or flip chip interconnections by use of electrically conducting adhesive materials.

BACKGROUND OF INVENTION

Electrical interconnection of an integrated circuit (IC) device to an external circuitry is a critical technology of microelectronic packaging, which often dictates the performance as well as the reliability of a whole electronic system, such as a computer system. At present, three technologies are commonly practiced to electrically interconnect a silicon IC to the next level of circuitry: wire bonding, tape automated bonding (TAB) and flip chip or controlled collapse chip connection (C4).

Wire bonding is the most widely used method for chip interconnection. Depending on the source of bonding energy supplied, wire bonding techniques are classified into three methods: thermocompression, ultrasonic, and thermosonic bonding. In thermocompression bonding, where heat and pressure are applied as the major source of bonding energy, gold wire is commonly used for ball and wedge bonding. Au wire is first melted to form a ball at the tip of the wire. While the ball is heated through a bonding capillary, the ball is pressed against the aluminum pad on a chip. The other end of the gold wire is then bonded to a gold-plated lead frame or substrate by thermocompression bonding. The bonding parameters to be adjusted are tool temperature, vertical force, and bonding time. The vertical force causes plastic deformation mainly in the wire, which enables intimate contact to occur between the bonding interfaces. The relatively high bonding temperature, 300–500° C., promotes interdiffusion at the bonding interface to form a metallurgical bond. It also facilitates the plastic deformation in the wire. However, when two dissimilar metals are bonded, such as Au to Al at an elevated temperature, the formation of undesirable intermetallic phases can occur at the interconnection.

In ultrasonic bonding, the wire is not heated directly. The vibrational energy supplied by a transducer mounted to a bonding tool is coupled with vertical force to form a bond between two metal surfaces. The most common metallurgy used in ultrasonic bonding is Al wire bonded to Al pad on chip or Au-plated pad on lead frame or substrate. A significant amount of plastic deformation is also observed in the ultrasonically bonded wire.

In thermosonic bonding, a bond stage is heated typically to 150° C., unlike thermocompression bonding where the bond wire is heated. The stage heating is known to improve the bondability of surfaces which are difficult to bond. In comparison to ultrasonic bonding, thermosonic bonding is used when a minimal amount of ultrasonic energy or vertical force is required due to the susceptibility of mechanical damage of the devices, such as chip cratering.

Although wire bonding is a simple and most economical method for chip interconnection, it has two fundamental limitations: a) it is limited in the maximum number of interconnections to be made for a given size of a chip by the length of the perimeter of the chip, and b) it is a serial process, where the throughput depends on the number of interconnections to be made. TAB technology can alleviate both of these limitations, because the bonding scheme is mass or gang bonding and interconnection with a finer pitch has been demonstrated. Two interconnections are made in TAB; inner lead bond (ILB), which connects a chip to tape, and outer lead bond (OLB), which connects tape to a substrate or board. The most common metallization structure used for TAB ILB joining is a Sn-plated Cu/polyimide tape and electroplated Au bumps on a chip. FIG. 1 is an illustration of the ILB bonding operation using a copper 17/polyimide 15 tape that is bonded to gold bumps 13 on a chip 11. To protect the copper surface, a thin layer of tin or gold is coated on it. Heat and force are supplied by a thermode 19 which heats the copper beams 17 and simultaneously presses them down to the gold bumps 13. When the tape is coated by tin, the bond is formed by the melting of the tin layer to react with the gold bumps. The bonding temperature required is in the range of 250 to 300° C., for a few seconds. The bonding pressure required is in the range of 20 to 30 Kpsi, and the total amount of force to be applied is therefore proportional to the number of interconnections to be made. Since the bonding occurs by the reaction of liquid tin with solid gold, much less force is required compared to the case of gold to gold thermocompression bonding of a gold coated tape with gold bumps. For the case of gold to gold bonding, a considerable amount of pressure and a high temperature ranging from 300 to 500° C., are required to accomplish a solid-state bonding.

Flip chip bonding is the most effective chip interconnection method currently used for high performance packaging applications. This bonding method utilizes solder bumps to connect high performance chips directly to a ceramic or organic substrate. Solder bumps of Pb—Sn alloy are deposited onto a wafer through a mask on each chip in a two dimensional array. Diced chips with solder bumps are flipped and roughly aligned to the bond pads on a substrate. Solder joints are formed by putting an assembly of chips on a substrate through a reflow furnace maintained at a temperature above the melting point of the solder bumps.

FIG. 2 is a schematic diagram showing a cross-sectional view of a solder bump with the thin film interface layers on both a silicon chip and a ceramic substrate. For the chip 21 side, typically a thin film layer of Cr 24/Cu 25/Au 26 is deposited prior to solder bump deposition, and a Ni 29/Au 28 layer is typically deposited to Mo bond pads 31 for the ceramic substrate 30 side. These interface layers provide adhesion to the underlying materials as well as providing a good solderable surface. Since solder bumps are in a liquid state during reflow, a series of fast reactions can occur at both interfaces; dissolution of Au layers and formation of various intermetallic compounds of Au—Sn, Cu—Sn, Ni—Sn and other ternaries.

Solder bumps in flip chip bonding serve not only as electrical interconnections, but also as mechanical/physical interconnections between the chip and the substrate. When an electronic system is in operation, the chip temperature goes up and down, resulting in thermal cycling. Since the solder bumps connect two material systems with different thermal coefficient of expansion, the differential thermal expansion between the chip and the substrate material induces a thermal strain in the solder interconnection. A repeated application of this kind of thermal strain leads to thermal fatigue of the solder joint, which eventually causes an electrical failure in the system. Thermal fatigue life is known to be affected strongly by the magnitude of the thermal strain induced in solder joints in a similar manner to the case of low cycle fatigue behavior in most engineering materials. To reduce or control thermal strain and the risk of solder joint failure, several approaches have been practiced: choosing new substrate materials which better match the thermal coefficient of the chip, improving thermal management to reduce the temperature differential between active devices and their environments, producing more compliant and "taller" solder joints, application of encapsulation materials around solder joints, and others.

SUMMARY OF INVENTION

In accordance with the present invention, a strong and compliant chip interconnection with a TAB package is made possible. Moreover, the present invention makes it possible to provide a stable TAB joint structure which does not cause excessive interfacial reactions at the joints. Also according to the present invention, a TAB structure which exhibits a longer fatigue life can be obtained.

The present invention also provides joining materials and method which make TAB inner lead bonding possible at a lower pressure, which in turn can reduce any damage to the circuitry. It is also possible according to aspects of the present invention to provide a joining material and method which can handle a larger chip size for a TAB package than that packaged by a conventional method.

Furthermore, pursuant to the present invention, a strong and compliant chip interconnection with a flip chip package is made possible. Moreover, the present invention makes it possible to provide a stable flip chip joint structure which does not cause excessive interfacial reactions at the joints. Also according to the present invention, a flip chip structure which gives a longer fatigue life can be obtained. It is also possible according to aspects of the present invention to provide a joining material and method which can handle a larger module size in a flip package than that packaged by a conventional method.

Moreover, in accordance with the present invention, a strong and compliant interconnection for an active matrix liquid crystal display (AMLCD) package is made possible. Also, the present invention makes it possible to provide a stable joint structure of an AMLCD package that does not cause excessive interfacial reactions at the joints. According to the present invention, an AMLCD package which gives a longer fatigue life and a better electrical performance can be achieved. It is also possible according to aspects of the present invention to provide a joining material and method which can handle a larger panel size in an AMLCD package than that packaged by a conventional method.

More particularly, an aspect of the present invention is an interconnection scheme of a tape automated bonding (TAB) package, a flip chip package and an active matrix liquid crystal display panel by use of an electrically conductive material formed from a plurality of conducting particles. Each conducting particle has an electrically conductive coating which is fused to an electrically conductive coating on an adjacent particle to form a network of fused conducting particles.

Another aspect of the present invention is a method of forming an electrically conductive joint between a conducting bump on a chip and a contact pad by forming a paste of particles having an electrically conductive coating and a polymeric material wherein the paste is disposed to be adhesively and electrically joined. Heat and pressure are provided to fuse the electrically conductive particles to themselves, and to metallurgically bond them to the contact pads.

A still further aspect of the present invention is a method of forming an electrically conductive joint between a glass panel of an AMLCD and TAB leads by forming a paste of particles having an electrically conductive coating and a polymeric material wherein the paste is disposed to be adhesively and electrically joined. Heat and pressure are provided to fuse the electrically conductive particles to themselves, and to metallurgically bond them to the contact pads.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BRIEF DESCRIPTION OF THE DRAWINGS

Further objects, features, and advantages of the present invention will become apparent from a consideration of the following detailed description of the invention when read in conjunction with the drawing FIGs., in which.

BEST AND VARIOUS MODES FOR CARRYING OUT INVENTION

In order to facilitate an understanding of the present invention, reference will be made to the figures.

Figure 1:
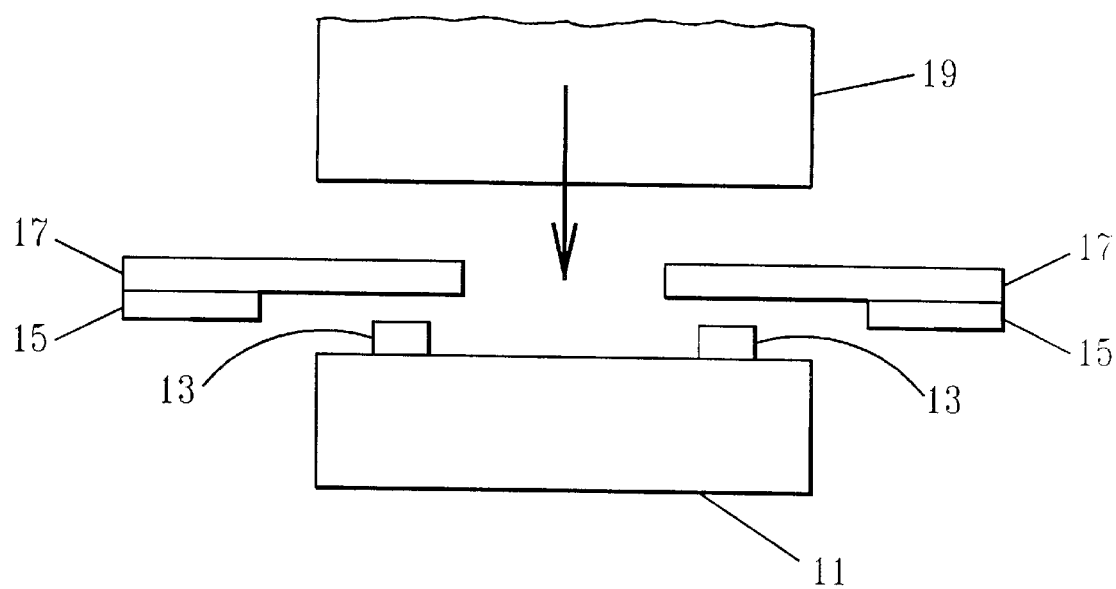
FIG. 1 is a schematic cross-sectional illustration representing a prior art tape automated bonding (TAB) interconnection to an integrated circuit device by use of a flexible TAB tape and a bumped chip. Thermocompression bonding is commonly used to bond the TAB beam leads to an integrated circuit device with a bumped structure.
Figure 3:
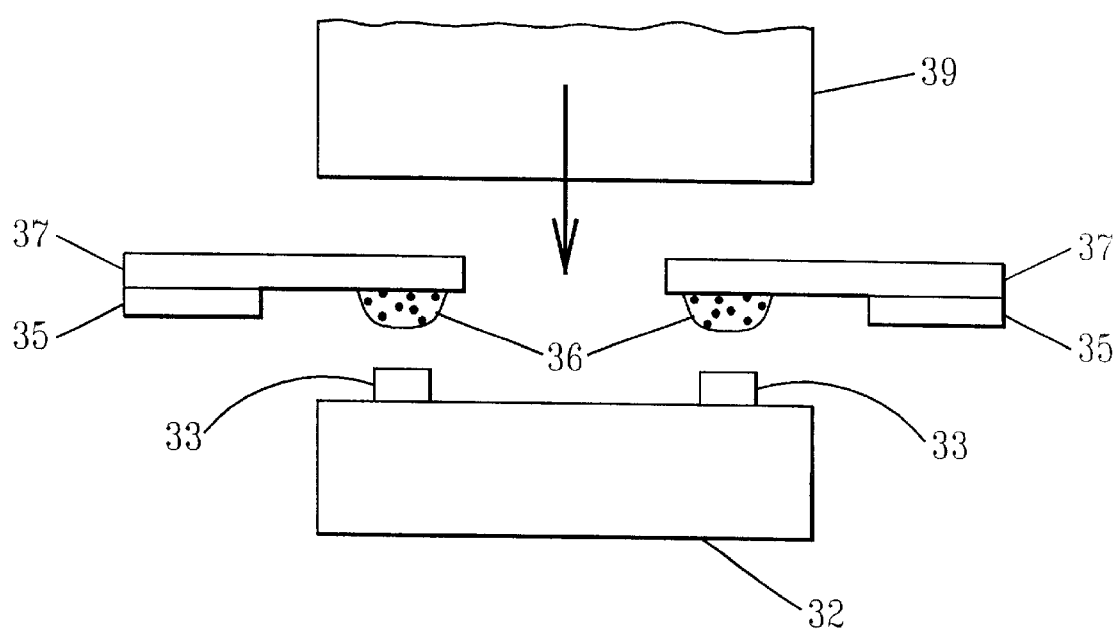
FIG. 3 is a schematic cross-sectional illustration representing a new TAB interconnection structure where a new electrically conductive paste developed according to the present invention is used to facilitate thermocompression bonding at a lower applied pressure, and to control the interfacial reaction at the joints, thereby enhancing the reliability of a TAB interconnection structure.
Figure 2:
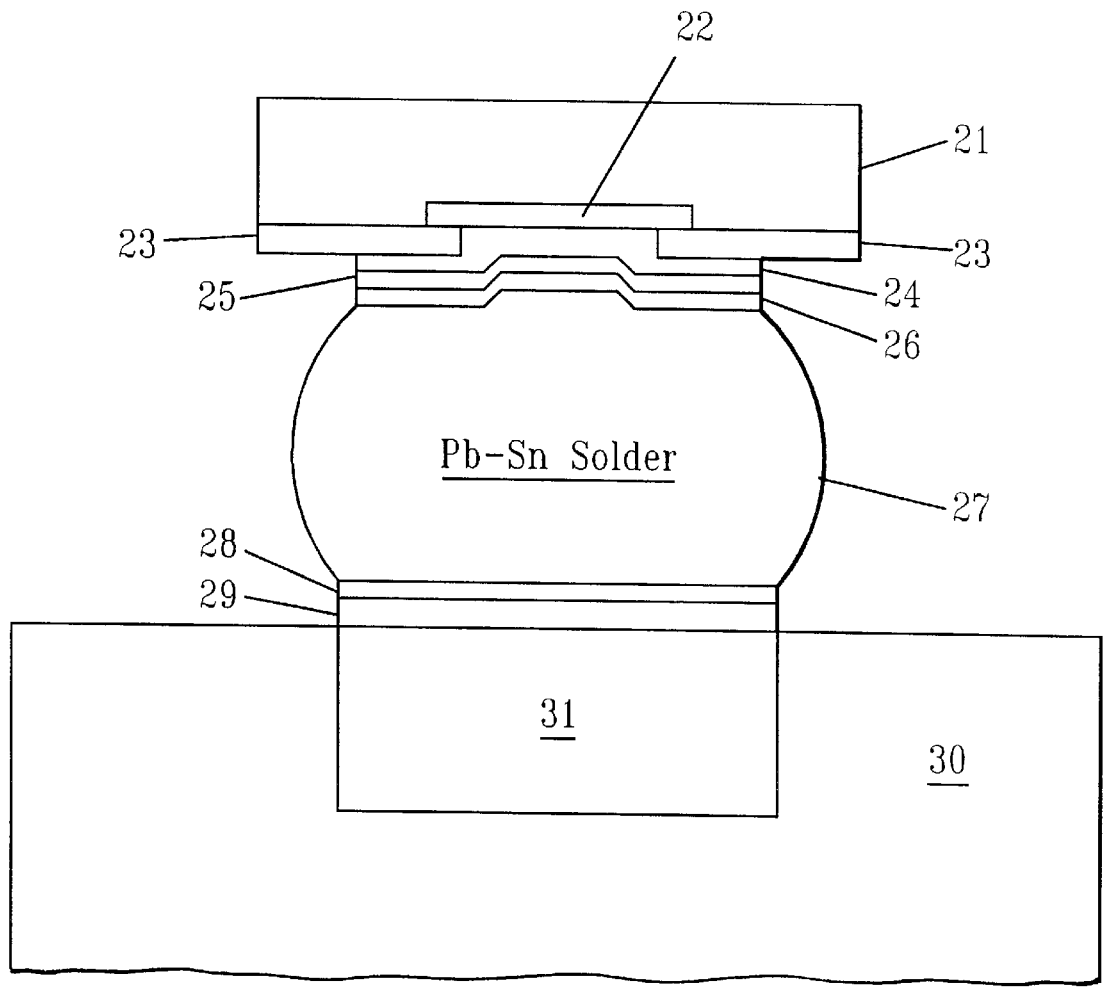
FIG. 2 is a schematic cross-sectional illustration representing a typical prior art flip chip interconnection to a ceramic module by use of solder bumps which are deposited on the terminal pads of an integrated circuit device.

According to an embodiment of the present invention, an example of a TAB package is schematically shown in FIG. 3, where the joining of TAB leads 37 to gold bumps 33 on an IC 32 is accomplished by using an electrically conductive adhesive 36. Examples of suitable electrically conductive paste adhesives 36 are disclosed in U.S. Ser. Nos. 08/641,406; 08/883,188; 60/052,172; 08/868,771 and 08/877,991, all of which are assigned to International Business Machines Corporation, the assignee of the present application, and entire disclosures of which are incorporated herein by reference.

These electrically conductive paste materials comprise conducting filler particles dispersed in a matrix of thermoplastic and/or thermoset polymer resin optionally with other ingredients. The electrically conducting adhesive preferably comprises:

a thermoplastic or thermoset polymer resin matrix, no-clean solder flux, and a plurality of electrically conducting particles with an electrically conducting fusible coating with at least some of the conducting particles being fused to other of the conducting particles through the electrically conductive fusible coating.

Preferably, the conducting particles are about 1 to about 50 micrometers in diameter. Preferably the electrically conducting fusible coating layer is about 0.1 to about 2 micrometers in thickness.

Typical examples of suitable polymer resin matrix materials are polyimides, siloxanes, polyimide-siloxanes, phenoxy polymers, styrene allyl alcohol polymers, epoxies and bio-based polymeric resins derived from at least one member of lignin, cellulose, wood oil, crop oil, or mixtures thereof.

Typical electrically conducting particles are Cu, Au, Ag, Al, Pd, Pt, mixtures and alloys thereof.

Typical electrically conducting fusible coatings are Sn, Zn, In, Pb, Bi and Sb, or combinations thereof.

By way of example, in U.S. Ser. No. 06/641,406, a Sn-plated Cu powder dispersed in a polymer resin matrix is disclosed. In U.S. Ser. No. 08/868,771, an In-plated Cu dendrite powder dispersed in a resin matrix is disclosed. In U.S. Ser. No. 60/052,172, a Bi/Sn-alloy-plated CU powder dispersed in a polymer resin matrix is disclosed. In U.S. Ser. No. 60/052,172 an In/Sn-plated (or Bi/Sn-plated) Cu dendrite powder dispersed in a polymer resin matrix is disclosed.

A small amount of the electrically conductive paste material 36 can be dispensed by a syringe at the tip area of TAB leads 37, which is a bare copper, or Sn-plated, or Au-plated or Au/Ni-plated surface. The conducting beam leads 37 can be supported by an insulating polymer layer such as polyimide, polyester and the like.

The use-of the electrically conductive adhesive materials with Bi/Sn or In/Sn coated fillers makes possible the TAB process even at a lower temperature than that of the conventional Au-to-Sn eutectic bonding. Additionally, when the Sn-plate tape is used with the electrically conductive paste material, the interfacial reaction at the Au bump surface is less extensive in comparison to that of the Au-to-Sn eutectic bonding. The resultant joint structure is expected to have a better mechanical and thermal fatigue properties than that of the conventional Au—Sn eutectic joint structure. For Au-plated Cu leads of a TAB tape, by using the electrically conductive adhesive materials, Au-to-Au thermocompression bonding process is now changed into Au-to-Sn or Au-to-In or Au-to-Bi/Sn metallurgical bonding, which can be accomplished at a much lower temperature. Additional advantages of using the electrically conductive adhesive materials for the TAB structure can be realized through less deformation of gold bumps than during thermocompression or eutectic bonding, since lower bonding pressures can be employed.

Figure 4:
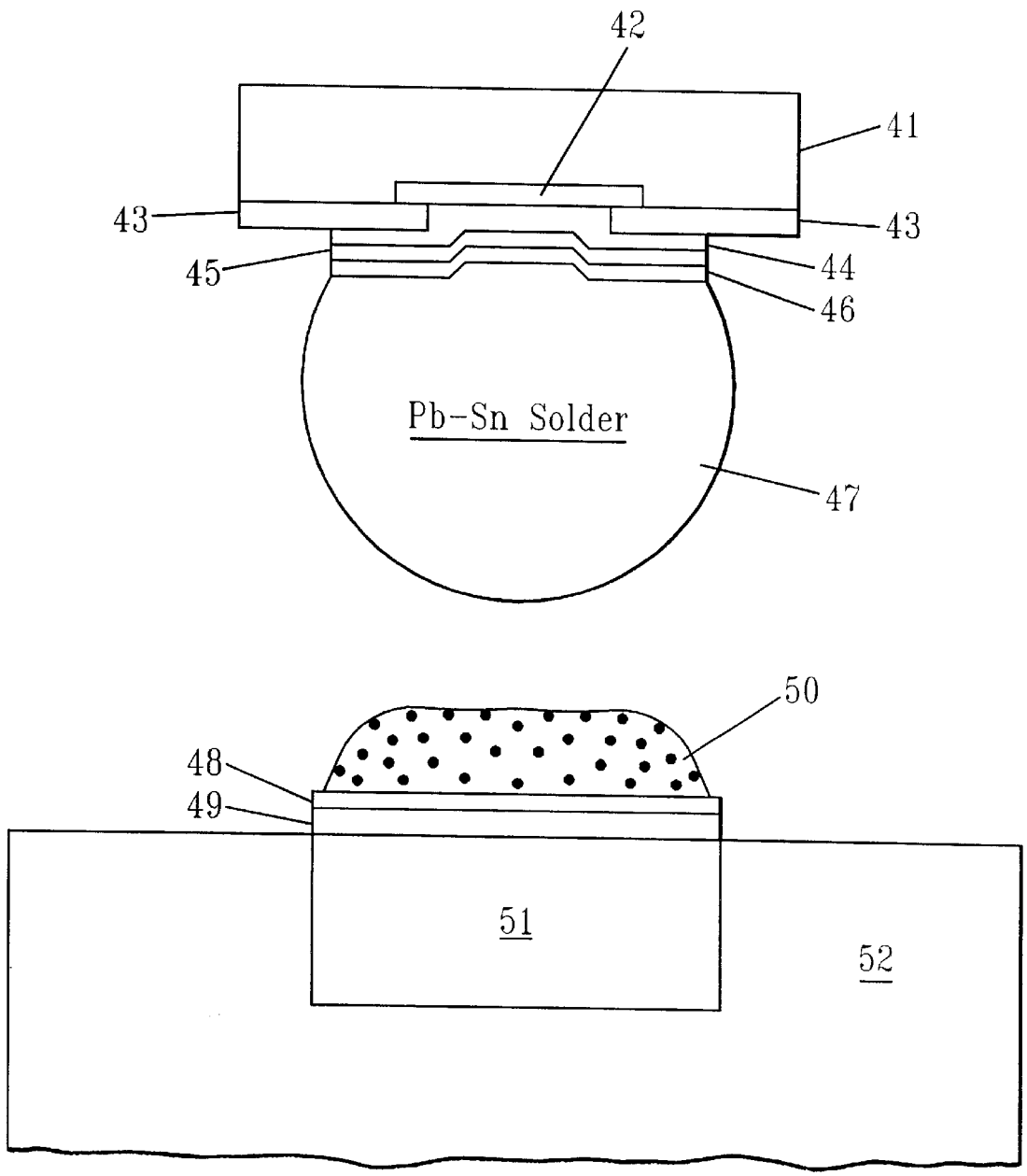
FIG. 4 is a schematic cross-sectional illustration representing a new flip chip interconnection structure where a new electrically conductive paste developed according to the present invention is used as a bonding material to reduce the joining temperature, to control the interfacial reaction, and thereby to enhance the reliability of a flip chip interconnection structure.

FIG. 4 illustrates another embodiment of the present invention, wherein a flip chip solder bump 47 is attached by use of an electrically conductive adhesive 50 to a module substrate 52. The electrically conductive adhesive 50 is the same as the adhesives 36 described with respect to FIG. 3. A small amount of the electrically conductive adhesives according to the present invention is dispensed either by a syringe or by screen printing on to a terminal pad 51 of a module 52, where the surface metallurgy layers of nickel 49 and gold 48 are deposited on top of the terminal pad 52, which is a molybdenum or copper metallization. An IC chip 41 is prepared by depositing a Pb—Sn solder bump 47 on top of the thin film layers having chromium or titanium or titanium tungsten 44, copper 4S and gold 46, which are deposited on top of a conducting pad 42 of aluminum or copper metallization. The solder bump 47 serves as a bonding pedestal, but does not melt during joining. Other bump materials such as Au, Cu, Ni, Co, Ag, Pd, Pt, Pb, Sn, In, Bi, Sb, Zn or alloys thereof or combinations thereof could also be used.

The electrically conductive adhesive material 50 forms a metallurgical joint with the bump as well as with the metallization 48/49 on the module substrate. By using the electrically conductive adhesive materials according to the present invention, a low temperature joining process is possible such as at the temperature range from about 150 to about 250° C. while the conventional flip chip bonding occurs above 350° C.

Since the conventional flip chip bonding requires a complete melting of a solder bump, there is an extensive formation of various intermetallic compounds at the joining interfaces as well as within the solder bump, which often raises a serious concern of the joint reliability. In the present invention, due to the low temperature joining associated with the electrically conductive adhesive materials and the localized reaction of the joining material, the formation of the intermetallic compounds is expected to be much less, which in turn would lead to a better joint integrity and enhanced joint reliability.

Figure 5:
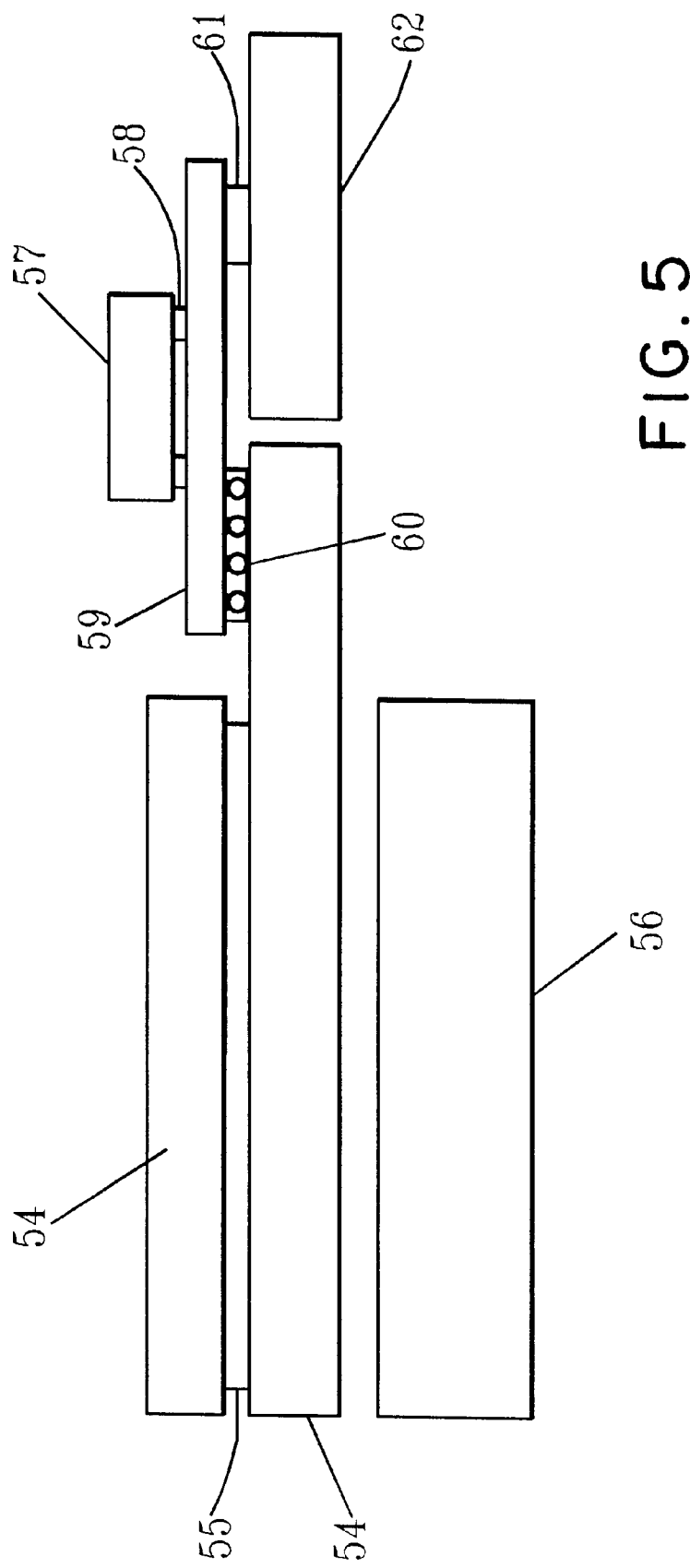
FIG. 5 is a schematic illustration representing an active matrix liquid crystal display (AMLCD) interconnection structure where a new electrically conductive adhesive material developed according to the present invention is used as a bonding material between a glass panel display and a printed circuit board.

FIG. 5 illustrates another embodiment of the present invention, wherein an active matrix liquid crystal display (AMLCD) is connected to a printed circuit board 62 by use of an electrically conductive adhesive 60. An AMLCD shown here comprises of three components: two glass plates 54, an illumination source 56, and a printed circuit board 62 containing electronics. A thin liquid crystal layer 55 is sandwiched between two glass plates 54, where on the top plate a color filter layer is formed and on the bottom plate an array of thin film transistors is built to modulate the light transmission through them. The connection between the glass plates 54 and the printed circuit board 62 is accomplished by use of a flexible TAB tape 59 where a drive chip 57 is attached to it by gold bumps 58.

The interconnection between the TAB tape 59 and the glass plate 54 is commonly achieved by the use of an anistropically conducting film (ACF), which is made of conducting filler particles of a few micrometers in diameter dispersed in an insulating polymer resin. The filler particles are either solid metal powder, (such as copper, nickel, gold, silver, palladium, solders) or plastic balls coated with gold/nickel. The ACF provides a conductive adhesive bonding between the TAB leads and the electrodes on a glass plate.

The ACF bonding is generally accomplished by an application of heat and pressure, but does not cause any metallurgical bonding at the joint. Since electrical conduction through the adhesive joint is made by a pressure contact of conducting members, the electrical properties of the joint are very sensitive to any thermal exposure which would cause a stress relaxation in the resin matrix.

In the present embodiment of FIG. 5, an electrically conductive adhesive 60 is used in place of the conventional ACF. The electrically conductive adhesive 60 is the same as the adhesives 36 described with respect to FIG. 3. To achieve a low temperature bonding, an electrically conductive adhesive with Bi/Sn- or In/Sn-coated filler is preferred. Upon an application of heat and pressure, a metallurgical bond is made among the conducting filler particles as well as between the particles and the substrates. The metallurgical bond in addition to the adhesive bond via the polymer resin matrix would provide a mechanically strong and electrically stable joint between the glass plates and the printed circuit board. The concept of the present invention can also be applied to enhance the prior art plastic balls coated with nickel and gold by additionally coating a fusible layer of Sn, In, Bi, Sb or alloys thereof. This would preserve the compressible nature of the plastic balls while enhancing their performance through metallurgical bonding made possible by the additional fusible coating.

By way of particular examples, in one particular embodiment in U.S. Ser. No. 08/641,406 is disclosed an electrically conductive paste made of tin-coated copper powder, polyimide-siloxane, solvent, carboxylic acid/surfactant, and no clean flux. A joining operation can be performed with this composition near the melting point of Sn, 230° C., where a metallurgical bonding of Sn-to-Sn or Sn-to-Au is accomplished at the particle-to-particle as well as particle-to-substrate pad interfaces. Because of the metallurgical bonding, a higher electrical conductivity as well as a higher joint strength were demonstrated with the joints made of the new paste material than with those of the silver-filled epoxy material. The metallurgical bonds also provided a stable electrical conductivity of the new joints upon thermal exposure and cycling. In another patent application U.S. Ser. No. 60/052,173 disclosed is an electrically conductive paste made of bismuth-tin coated copper powder, thermoplastic polymer resin, solvent, and no-clean flux. A joining operation can be performed near the eutectic temperature of the Bi—Sn alloy, which is about 139° C. In another patent application U.S. Ser. No. 08/868,771 disclosed is an electrically conductive paste made of indium-tin coated copper powder, thermoplastic polymer resin, solvent, and no-clean flux. A joining operation can be performed near the eutectic temperature of the In—Sn alloy, which is 120° C. The electrically conductive pastes with either Bi—Sn coated or In—Sn coated Cu powder can be used with polymeric printed circuit boards, while that with Sn-coated Cu powder can be used with ceramic substrates.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A structure comprising:
   a plurality of electrically conducting bumps in an array on an integrated circuit device for a flip chip interconnection;
   said bumps being electrically and mechanically joined to terminal pads on an electronic chip carrier module by an electrically conducting adhesive;
   said electrically conducting adhesive being deposited either on the said terminal pads of the said chip carrier module or on the said conducting bumps on the said integrated circuit device,
   and wherein the said electrically conducting adhesive comprises:
   a thermoplastic or thermoset polymer resin matrix,
   no-clean solder flux, and
   a plurality of electrically conducting particles with an electrically conducting fusible coating with at least some of said particles being fused to other said particles through said electrically conductive fusible coating.

2. A structure according to claim 1, wherein the said conducting bumps are made from metals selected from the group consisting of Au, Cu, Ni, Co, Ag, Pd, Pt, Pb, Sn, In, Bi, Sb, Sn, and alloys thereof.

3. A structure according to claim 1, wherein the said conducting bumps are deposited on thin film layers selected from the group consisting of Cr/Cu/Au or Ti/Cu/Au and TiW/Cu/Au, and wherein the said thin film layers are deposited on aluminum or copper metallization of an integrated circuit device.

4. A structure according to claim 1, wherein said electrically conducting particles are formed from at least one material selected from the group consisting of Cu, Au, Ag, Al, Pd and Pt.

5. A structure according to claim 1, wherein said electrical coating is selected from the group consisting of Sn, Zn, In, Pb, Bi and Sb, and combinations thereof.

6. A structure according to claim 1, wherein said polymeric material is selected from the group consisting of polyimide, siloxane, polyimide-siloxane, phenoxy polymers, styrene allyl alcohol polymers, epoxies and bio-based polymeric resins derived from at least one member selected from the group consisting of lignin, cellulose, wood oil and crop oil.

7. A structure according to claim 1, wherein said polymeric material provides adhesive joining of said solder bumps.

8. A structure according to claim 1, wherein said conducting particles are about 1 to about 50 micrometers in diameter.

9. A structure according to claim 1, wherein said fusible coating layer is about 0.1 to about 2 micrometers in thickness.

10. A structure according to claim 1, wherein said structure is an electronic device.

11. A structure according to claim 1, wherein said structure is a computing device.

12. A structure according to claim 1, wherein said structure is an electronic chip carrier of a flip chip package.

13. A structure according to claim 1, wherein the attachment of the said solder bumps to the said electronic module with the said conducting adhesive is achieved by the application of heat and pressure for a duration of time.

14. A structure according to claim 1, wherein the disposition of the said conducting adhesive is achieved to the said terminal pads of an electronic module by use of a syringe or screen print.

15. A structure according to claim 1, wherein the disposition of the said conducting adhesive is achieved to the top of the said solder bumps on an integrated circuit device by use of a syringe or screen print.

* * * * *